(12) United States Patent
Nguyen et al.

(10) Patent No.: US 11,699,491 B2
(45) Date of Patent: Jul. 11, 2023

(54) DOUBLE INTERLEAVED PROGRAMMING OF A MEMORY DEVICE IN A MEMORY SUB-SYSTEM

(71) Applicant: Micron Technology, Inc., Boise, ID (US)

(72) Inventors: Phong Sy Nguyen, Livermore, CA (US); James Fitzpatrick, Laguna Niguel, CA (US); Kishore Kumar Muchherla, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 19 days.

(21) Appl. No.: 17/247,643

(22) Filed: Dec. 18, 2020

(65) Prior Publication Data

US 2022/0199165 A1    Jun. 23, 2022

(51) Int. Cl.
*G11C 16/20* (2006.01)
*G11C 16/30* (2006.01)
*G11C 16/26* (2006.01)

(52) U.S. Cl.
CPC ........... *G11C 16/20* (2013.01); *G11C 16/26* (2013.01); *G11C 16/30* (2013.01); *G11C 2211/561* (2013.01)

(58) Field of Classification Search
CPC ......... G11C 16/20; G11C 16/26; G11C 16/30; G11C 2211/561
See application file for complete search history.

(56) References Cited

U.S. PATENT DOCUMENTS

2021/0158874 A1* 5/2021 Jang .................. G11C 16/10

* cited by examiner

*Primary Examiner* — Xiaochun L Chen
(74) *Attorney, Agent, or Firm* — Lowenstein Sandler LLP

(57) ABSTRACT

Control logic in a memory device identifies a first plurality of groups of programming distributions, wherein each group comprises a subset of programming distributions associated with a portion of a memory array of the memory device configured as quad-level (QLC) memory. During a first pass of a multi-pass programming operation, the control logic coarsely programs memory cells in the portion configured as QLC memory to initial values representing a second plurality of pages of host data and stores, in a portion of the memory array of the memory device configured as single-level cell (SLC) memory, an indicator of the first plurality of groups of programming distributions with which each of the coarsely programmed memory cells is associated. During a second pass of the multi-pass programming operation, the control logic reads the coarsely programmed initial values from the first pass based on the indicator of the first plurality of groups of programming distributions and finely programs the memory cells in the portion configured as QLC memory to final values representing the second plurality of pages of host data.

20 Claims, 6 Drawing Sheets

DOUBLE INTERLEAVED PROGRAMMING OF A MEMORY DEVICE IN A MEMORY SUB-SYSTEM

TECHNICAL FIELD

Embodiments of the disclosure relate generally to memory sub-systems, and more specifically, relate to double interleaved programming of a memory device in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
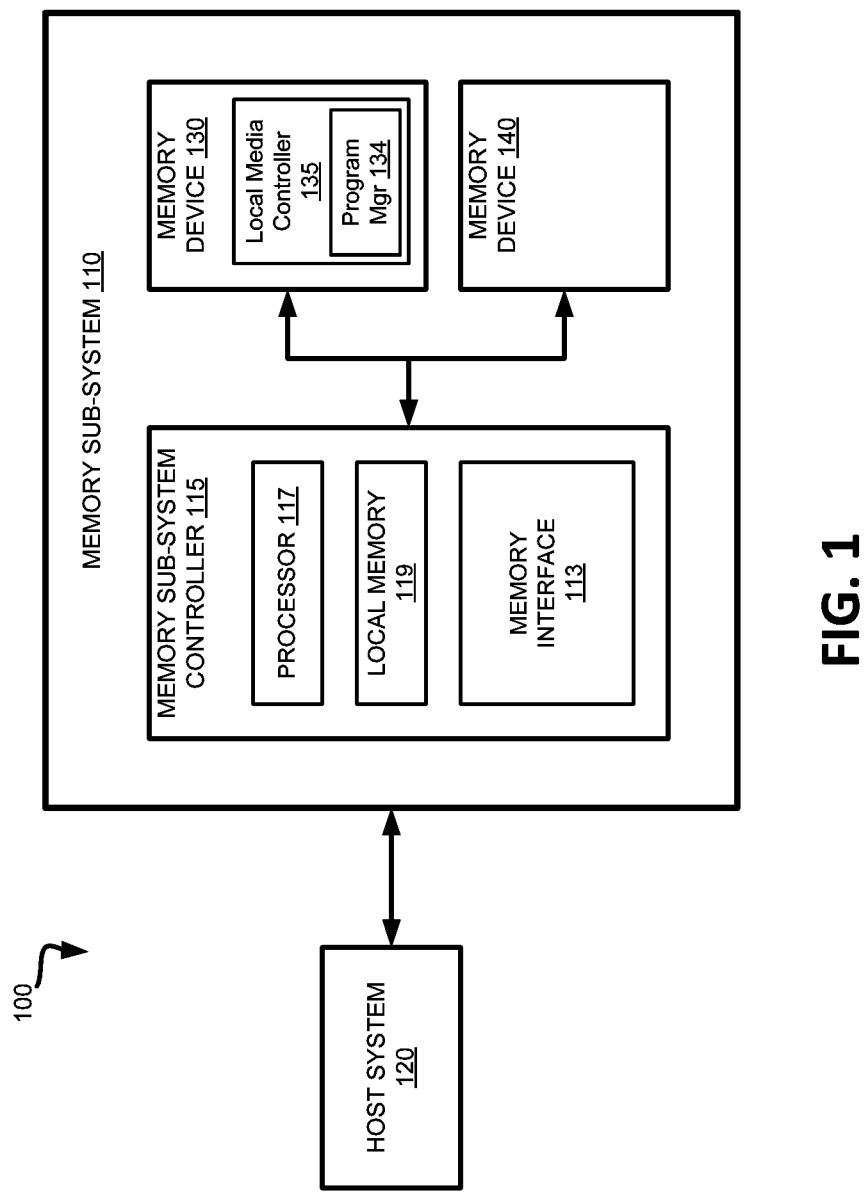
FIG. 1 illustrates an example computing system that includes a memory sub-system in accordance with some embodiments of the present disclosure.

Aspects of the present disclosure are directed to double interleaved programming of a memory device in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or a three-dimensional grid. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include multiple access line driver circuits and power circuits that can be shared by the planes of the memory device to facilitate concurrent access of pages of two or more memory planes, including different page types. For ease of description, these circuits can be generally referred to as independent plane driver circuits. Depending on the storage architecture employed, data can be stored across the memory planes (i.e. in stripes). Accordingly, one request to read a segment of data (e.g., corresponding to one or more data addresses), can result in read operations performed on two or more of the memory planes of the memory device.

Some memory devices use certain types of memory cells, such as quad-level cell (QLC) memory cells, which store four bits of data in each memory cell, which make it affordable to move more applications from legacy hard disk drives to newer memory sub-systems, such as NAND solid-state drives (SSDs). QLC memory is particularly well-tuned for read-intensive workloads, which are often seen in data center applications where data is normally generated once, and then read regularly to perform calculations and analysis. Thus, QLC memory is often considered to be fragile and used only for very light write workloads, as the endurance and Quality of Service (QoS) can limit usability in data center applications.

Certain memory sub-systems implementing QLC memory use a standard 16-16 coarse-fine, two pass, programming algorithm. Since a QLC memory cell stores four bits of data, there are 16 possible programming levels (i.e., $2^4$) representing the possible values of those four bits of data. Programming a wordline begins by coarsely programming all 16 levels in a first pass. The objective of this "coarse," first pass is to program all cells rapidly to slightly below their final target programming levels. During the slower, "fine," second pass, the memory cells are programmed to a slightly higher final target programmed voltage. Such two-pass programming minimizes cell to cell (C2C) interference, as every cell and its neighbors are nearly at their final target programmed voltage when the fine programming pass is performed, and need only be "touched-up." The combination of not requiring precision programming in the first pass, and the minimized C2C coupling, leads to fast programming with high read window budget (RWB). Such standard 16-16 coarse-fine programming, however, requires all data to be first written to single level cell (SLC) memory (i.e., memory cells storing one bit of data per cell) before the first pass to protect against asynchronous power loss (APL). With large amounts of data passing through SLC memory, the underlying media can wear out, unless large amounts of SLC memory are allocated. However, blocks allocated as SLC memory take away space from QLC memory, thereby reducing the capacity of the memory device, and result in additional QLC write amplification. The increased write amplification reduces the endurance of the memory device and degrades random write performance.

Other memory sub-systems implementing QLC memory use a 2-8-16, three pass, programming algorithm. With this approach, programming a wordline begins by programming two levels, representing one page (e.g., a lower page (LP)), in a first pass. During the second pass, data for two more pages (e.g., an upper page (UP) and an extra page (XP)) is received, and a pre-read operation is performed to read out the previously written LP data, before programming eight levels, representing the three pages. During the third pass, data for a fourth page (e.g., a top page (TP)) is received, and a pre-read operation is performed to read out the previously written LP, UP, and XP data, before programming all 16 levels. The pre-read operations performed in such three-pass programming increases the programming time and leads to an unbalanced Gray code (e.g., 1-3-3-8) which causes QoS concerns in the memory sub-system. In addition, without the touch-up effect of the coarse-fine programming, the RWB is decreased, which can lead to an increased error rate when the programmed data is later read from the memory device.

Aspects of the present disclosure address the above and other deficiencies by implementing double interleaved programming of a memory device in a memory sub-system. In one embodiment, the memory sub-system uses a double interleaved 16-16, two-pass, programming algorithm ("$i^2$-16-16") based on the standard 16-16, coarse-fine, programming described above. The double interleaved programming, however, consumes only two SLC memory pages per four QLC pages (i.e., LP, UP, XP, TP) being programmed. In addition, the SLC usage and pre-read operations are executed differently with double interleaved programming, where the 16 voltage distributions representing the four host pages are split into multiple groups of distributions (e.g., four groups of four distributions each). Rather than storing all four host pages in SLC memory during QLC programming, only enough pages of data are stored in SLC memory to provide an indication of one of the multiple groups of distributions (e.g., 2 pages of group indicator information can represent one of four distribution groups). After a first "coarse" programming pass of all 16 programming levels, control logic of the memory device can, based on the group indicator stored in SLC memory, perform a pre-read operation using only one of the multiple groups of distributions, which has a much larger RWB and a lower associated error rate. Thus, in the second "fine" programming pass, the control logic can quickly and accurately determine the coarsely programmed voltages and perform the touch-up programming to bring the memory cells to their final target programming voltages.

Advantages of this approach include, but are not limited to, improved performance in the memory sub-system. In the manner described herein, the desirable properties of the standard two pass 16-16 programming algorithm, such as the touch-up effect and balanced Gray codes, are maintained while the SLC memory usage is reduced. In addition, the pre-read margin issues encountered in the 2-8-16 programming algorithm are minimized. Accordingly, the overall quality of service level of the memory sub-system is improved, as is an endurance of the QLC memory.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device.

In one embodiment, the memory sub-system 110 includes a memory interface component 113. Memory interface component 113 is responsible for handling interactions of memory sub-system controller 115 with the memory devices of memory sub-system 110, such as memory device 130. For example, memory interface component 113 can send memory access commands corresponding to requests received from host system 120 to memory device 130, such as program commands, read commands, or other commands. In addition, memory interface component 113 can receive data from memory device 130, such as data retrieved in response to a read command or a confirmation that a program command was successfully performed. For example, the memory sub-system controller 115 can include a processor 117 (processing device) configured to execute instructions stored in local memory 119 for performing the operations described herein.

In one embodiment, memory device 130 includes a program manager 134 configured to carry out corresponding memory access operations, in response to receiving the memory access commands from memory interface 113. In some embodiments, local media controller 135 includes at least a portion of program manager 134 and is configured to perform the functionality described herein. In some embodiments, program manager 134 is implemented on memory device 130 using firmware, hardware components, or a combination of the above. In one embodiment, program manager 134 receives, from a requestor, such as memory interface 113, a request to program data to a memory array of memory device 130. In one embodiment, the memory array can include a first portion configured as SLC memory, and a second portion configured as QLC memory. The voltage levels of the memory cells in QLC memory form a set of 16 programming distributions representing the 16 different combinations of the four bits stored in each memory cell. In one embodiment, program manager 134 can divide those 16 programming distributions into a number of groups, such as four groups each including four programming distributions. Thus, the resulting groups of programming distributions look like MLC distributions representing the four different combinations of two bits of data. Two indicator pages with values that indicate the group of programming distributions to which each memory cell in the QLC memory belongs can be stored in the SLC memory. Program manager 134 can perform a pre-read operation on a second pass of the programming operation to determine a coarsely programmed voltage level of each cell by using read voltages corresponding to the associated group of programming distributions. Further details with regards to the operations of program manager 134 are described below.

Figure 2A:
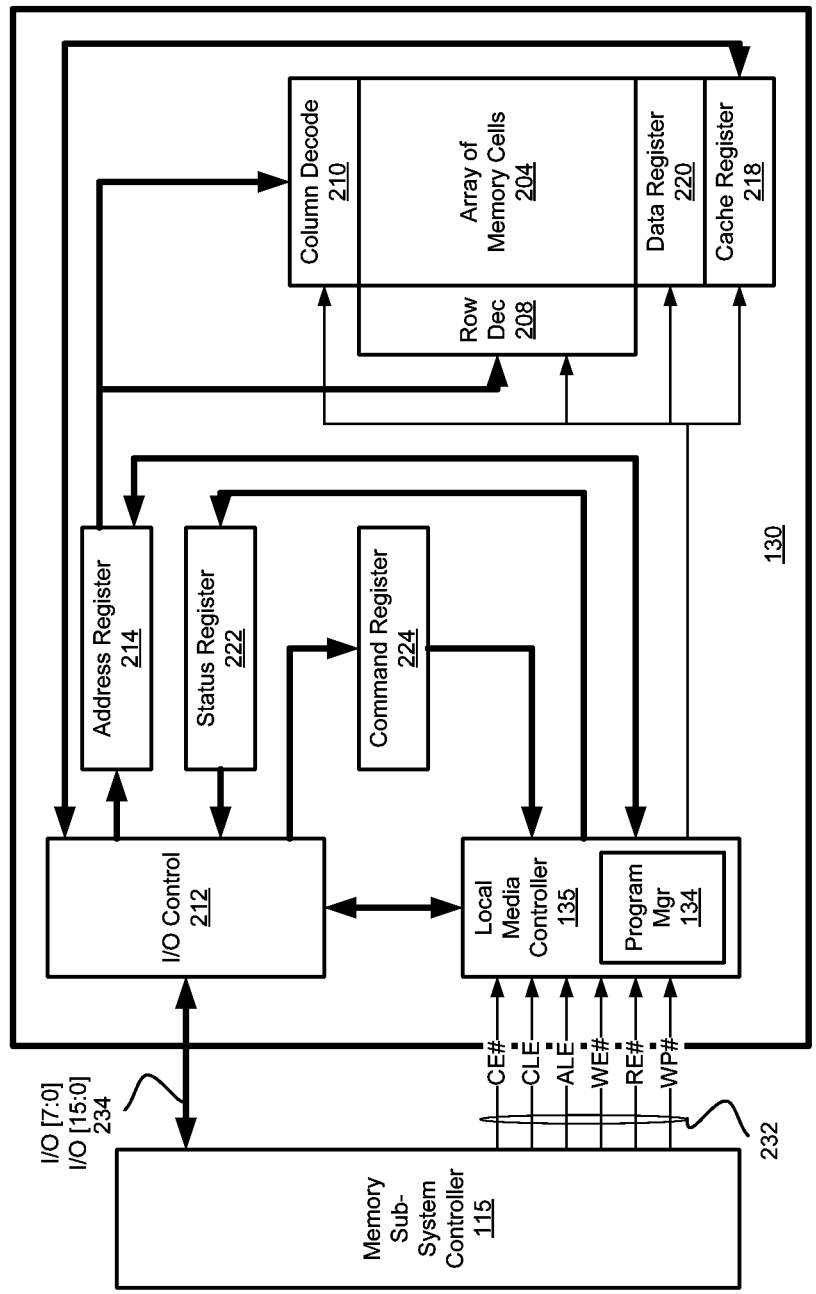
FIG. 2A is a block diagram of a memory device in communication with a memory sub-system controller of a memory sub-system, according to an embodiment.

FIG. 2A is a simplified block diagram of a first apparatus, in the form of a memory device 130, in communication with a second apparatus, in the form of a memory sub-system controller 115 of a memory sub-system (e.g., memory sub-system 110 of FIG. 1), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 204 logically arranged in rows and columns. Memory cells of a logical row are typically connected to the same access line (e.g., a word line) while memory cells of a logical column are typically selectively connected to the same data line (e.g., a bit line). A single access line may be associated with more than one logical row of memory cells and a single data line may be associated with more than one logical column. Memory cells (not shown in FIG. 2A) of at least a portion of array of memory cells 204 are capable of being programmed to one of at least two target data states.

Row decode circuitry 208 and column decode circuitry 210 are provided to decode address signals. Address signals are received and decoded to access the array of memory cells 204. Memory device 130 also includes input/output (I/O) control circuitry 212 to manage input of commands, addresses and data to the memory device 130 as well as output of data and status information from the memory device 130. An address register 214 is in communication with I/O control circuitry 212 and row decode circuitry 208 and column decode circuitry 210 to latch the address signals prior to decoding. A command register 224 is in communication with I/O control circuitry 212 and local media controller 135 to latch incoming commands.

A controller (e.g., the local media controller 135 internal to the memory device 130) controls access to the array of memory cells 204 in response to the commands and generates status information for the external memory sub-system controller 115, i.e., the local media controller 135 is configured to perform access operations (e.g., read operations, programming operations and/or erase operations) on the array of memory cells 204. The local media controller 135 is in communication with row decode circuitry 208 and column decode circuitry 210 to control the row decode circuitry 208 and column decode circuitry 210 in response to the addresses. In one embodiment, local media controller 134 includes program manager 134, which can implement the double interleaved programming of memory device 130, as described herein.

The local media controller 135 is also in communication with a cache register 218. Cache register 218 latches data, either incoming or outgoing, as directed by the local media controller 135 to temporarily store data while the array of memory cells 204 is busy writing or reading, respectively, other data. During a program operation (e.g., write operation), data may be passed from the cache register 218 to the data register 220 for transfer to the array of memory cells 204; then new data may be latched in the cache register 218 from the I/O control circuitry 212. During a read operation, data may be passed from the cache register 218 to the I/O control circuitry 212 for output to the memory sub-system controller 115; then new data may be passed from the data register 220 to the cache register 218. The cache register 218 and/or the data register 220 may form (e.g., may form a portion of) a page buffer of the memory device 130. A page buffer may further include sensing devices (not shown in FIG. 2A) to sense a data state of a memory cell of the array of memory cells 204, e.g., by sensing a state of a data line connected to that memory cell. A status register 222 may be in communication with I/O control circuitry 212 and the local memory controller 135 to latch the status information for output to the memory sub-system controller 115.

Memory device 130 receives control signals at the memory sub-system controller 115 from the local media controller 135 over a control link 232. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 232 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 234 and outputs data to the memory sub-system controller 115 over I/O bus 234.

For example, the commands may be received over input/output (I/O) pins [7:0] of I/O bus 234 at I/O control circuitry 212 and may then be written into command register 224. The addresses may be received over input/output (I/O) pins [7:0] of I/O bus 234 at I/O control circuitry 212 and may then be written into address register 214. The data may be received over input/output (I/O) pins [7:0] for an 8-bit device or input/output (I/O) pins [15:0] for a 16-bit device at I/O control circuitry 212 and then may be written into cache register 218. The data may be subsequently written into data register 220 for programming the array of memory cells 204.

In an embodiment, cache register 218 may be omitted, and the data may be written directly into data register 220. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 2A has been simplified. It should be recognized that the functionality of the various block components described with reference to FIG. 2A may not necessarily be segregated to distinct components or component portions of an integrated circuit device. For example, a single component or component portion of an integrated circuit device could be adapted to perform the functionality of more than one block component of FIG. 2A. Alternatively, one or more components or component portions of an integrated circuit device could be combined to perform the functionality of a single block component of FIG. 2A. Additionally, while specific I/O pins are described in accordance with popular conventions for receipt and output of the various signals, it is noted that other combinations or numbers of I/O pins (or other I/O node structures) may be used in the various embodiments.

Figure 2B:
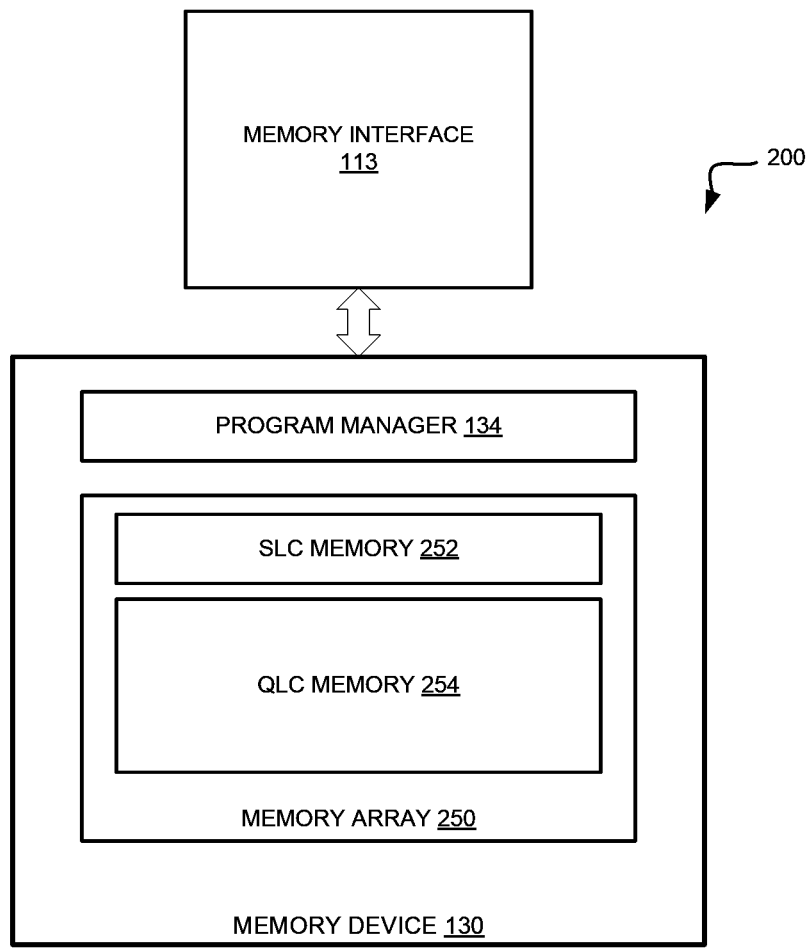
FIG. 2B is a block diagram illustrating a memory sub-system implementing double interleaved programming in accordance with some embodiments of the present disclosure.

FIG. 2B is a block diagram 200 illustrating a memory sub-system implementing double interleaved programming in accordance with some embodiments of the present disclosure. In one embodiment, memory interface 113 is operatively coupled with memory device 130. In one embodiment, memory device 130 includes program manager 134 and memory array 250, which is one example of the array of memory cells 204 illustrated in FIG. 2A. Memory array 250 can include an array of memory cells formed at the intersections of wordlines and bitlines. In one embodiment, the memory cells are grouped in to blocks, which can be further divided into sub-blocks, where a given wordline is shared across a number of sub-blocks, for example. In one embodiment, each sub-block corresponds to a separate plane in the memory array 250. The group of memory cells associated with a wordline within a sub-block is referred to as a physical page. In one embodiment, there can be a first portion 252 of the memory array 250 where the sub-blocks are configured as SLC memory and a second portion 254 of the memory array 250 where the sub-blocks are configured as QLC memory. Depending on how they are configured, each physical page in one of the sub-blocks can include multiple page types. For example, a physical page formed from single level cells (SLCs) has a single page type referred to as a lower logical page (LP). Multi-level cell (MLC) physical page types can include LPs and upper logical pages (UPs), TLC physical page types are LPs, UPs, and extra logical pages (XPs), and QLC physical page types are LPs, UPs, XPs and top logical pages (TPs). For example, a physical page formed from memory cells of the QLC memory type can have a total of four logical pages, where each logical page can store data distinct from the data stored in the other logical pages associated with that physical page.

Depending on the programming scheme used, each logical page of a memory cell can be programmed in a separate programming pass, or multiple logical pages can be programmed together. For example, in a QLC physical page, the LP and UP can be programmed on one pass, and the XP and TP can be programmed on a second pass. Other programming schemes are possible. In one embodiment, program manager 134 can receive, for example, four pages of host data to be programmed to the QLC memory 254. Accordingly, in order for one bit from each of the four pages to be programmed to each memory cell, program manager 134 can program each memory cell to one of 16 possible programming levels (i.e., voltages representing the 16 different values of those four bits). Thus, the four pages of host data will be represented by 16 different programming distributions. In one embodiment, program manager 134 can divide those 16 programming distributions into a number of groups each including a smaller number of those distributions. For example, in one embodiment, program manager 134 can form four groups each including four programming distributions. Since each group has fewer than 16 programming distributions, the RWB between those distributions will be greater, thereby allowing the corresponding memory cells to be read with less errors. In addition, program manager 134 can form a number of group indicator pages (e.g., two group indicator pages) to indicate the group of programming distributions to which each memory cell in the QLC memory 254 belongs. Program manager 134 can store those group indicator pages in the first portion of the memory array 250 configured as SLC memory 252. Program manager 134 can then perform the first pass of the programming operation to coarsely program the cells in QLC memory 254 to the voltage levels representing the four pages of host data.

Subsequently, prior to performing the second pass of the programming operation, program manager 134 can read the group indicator pages stored in SLC memory 252, which will indicate the group of programming distributions to which each memory cell in the QLC memory 254 belongs. Since there are different programming distributions in each group, there can also be different read voltages associated with each group, which are designed to be located between the specific distributions of that particular group. In one embodiment, program manager 134 can perform a pre-read operation of the memory cells in QLC memory 254 in each group of programming distributions using the corresponding read voltages. For example, program manager 134 can identify the group of programming distributions to which a given memory cell in QLC memory 254 belongs, and perform the pre-read operation to determine the coarsely programmed voltage levels of the memory cells in QLC memory 254 using the read voltages associated with the corresponding groups of programming distributions. The other groups of programming distributions (i.e., those groups that are not being read) can be masked to avoid interference during the pre-read operation. Upon determining the coarsely programmed voltage levels, program manager 134 can perform the second pass of the programming operation to finely program the memory cells in QLC memory 254 to the voltage levels representing the four pages of host data. The second pass can include touching up the coarsely programmed voltage levels to reach the target voltage levels representing the four pages of host data. In this manner, program manager 134 can reliably read out the coarsely programmed voltage levels for four pages of host data from the first programming pass, while utilizing only two pages of SLC memory 252 for the group indicator pages.

Figure 3:
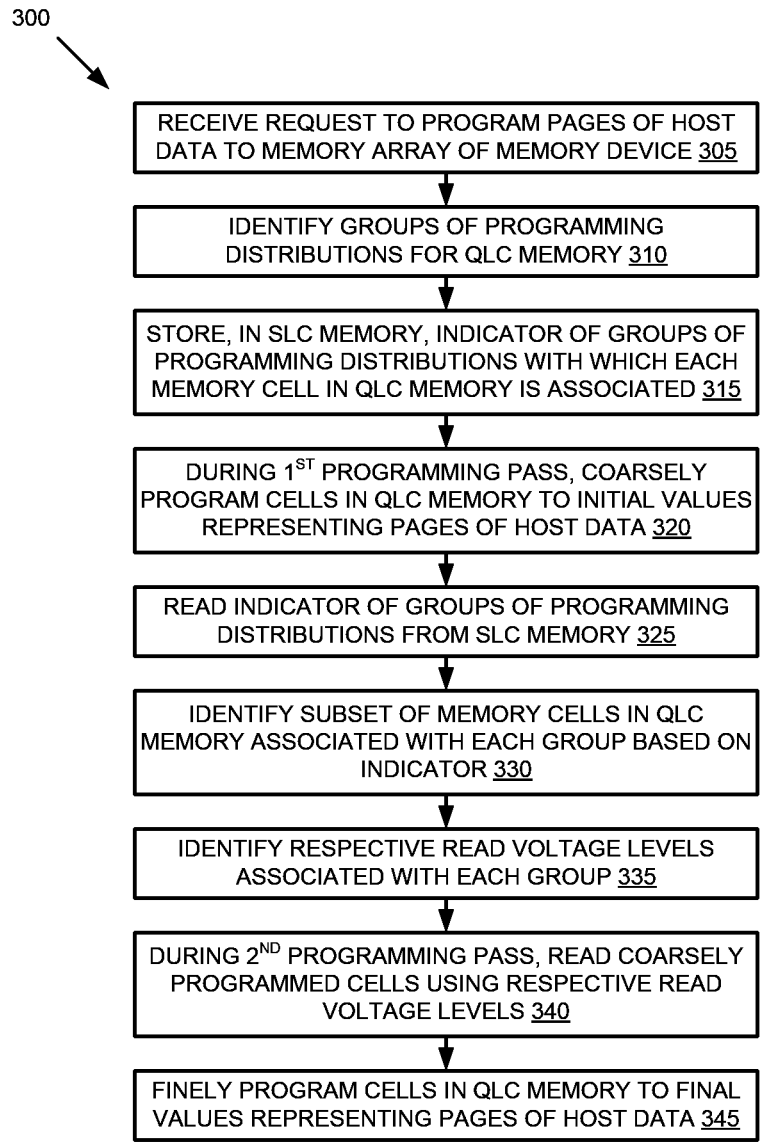
FIG. 3 is a flow diagram of an example method of double interleaved programming of a memory device in a memory sub-system in accordance with some embodiments of the present disclosure.

FIG. 3 is a flow diagram of an example method of double interleaved programming of a memory device in a memory sub-system in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by program manager 134 of FIG. 1, FIG. 2A, and FIG. 2B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 305, a command/request is received. For example, processing logic (e.g., program manager 134) can receive, from a requestor, such as a memory interface 113 of a memory sub-system controller 115, a first request to perform a memory access operation on a memory array, such as memory array 250, of a memory device, such as memory device 130. In one embodiment, the memory access operation comprises a program operation. For example, the memory access operation can include a QLC program operation associated with a plurality of pages (e.g., four pages) of host data.

At operation 310, groups of programming distributions are identified. For example, the processing logic can identifying a plurality of groups (e.g., four groups) of programming distributions. If one bit from each of the four pages of host data is to be programmed to each memory cell, program manager 134 can program each memory cell to one of 16 possible programming levels (i.e., voltages representing the 16 different values of those four bits). Thus, the four pages of host data will be represented by 16 different programming distributions, as illustrated by graph 410 in FIG. 4. The 16 programming distributions can be referred to as D0-D15. In other embodiments, there can be some other number of programming distributions. In one embodiment, program manager 134 can divide those 16 programming distributions into four groups each including a smaller number of those distributions (e.g., four distributions), as illustrated by graph 420 in FIG. 4. Thus, each group comprises a subset of the programming distributions associated with a portion of a memory array of a memory device configured as quad-level (QLC) memory, such as portion 254. For example, in one embodiment, Group0 can include D0, D4, D8, and D12, Group1 can include D1, D5, D9, and D13, Group2 can includes D2, D6, D10, and D14, and Group3 can include D3, D7, D11, and D15. In other embodiments, there can be some other number of groups each including some other number of programming distributions.

At operation 315, an indicator is generated and stored. For example, the processing logic can generate and store, in a portion of the memory array configured as SLC memory 252, an indicator of the groups of programming distributions, such as those identified at operation 310, with which each of the programmed memory cells coarsely programmed at operation 315 is associated. In one embodiment, a memory cell is associated with a given group if the memory cell is programmed to a voltage level that falls within one of the programming distributions that makes up the given group. For example, if the memory cell is programmed to a voltage level that falls within distribution D5, the memory cell would be associated with Group1. In one embodiment, the indicator of the groups comprises a plurality of pages (e.g., two pages) of group indicator data. Thus, the number of pages of group indicator data is less than the number of pages of host data being programmed. Accordingly, less SLC memory 252 is used for the multi-pass programming operation, and the capacity of the memory array 250 is increased.

At operation 320, a memory access operation is initiated. For example, the processing logic can initiate the memory access operation on the memory array 250. In one embodiment, the memory access operation includes a multi-pass program operation, where the memory cells of the memory array 250 are programmed in two or more programming passes. In one embodiment, during a first pass of the multi-pass programming operations, the processing logic coarsely programs memory cells in the portion configured as QLC memory 254 to initial values representing the pages of host data. In one embodiment, program manager 134 can cause one or more programming pulses to be applied to the corresponding wordlines of memory array 250 to store the pages of the host data in the memory cells of the memory array 250. The initial values can be slightly below final target values so that the first programming pass can be performed with minimal latency. Depending on the embodiment, the order of the operations described herein can vary. For example, as described above, the memory access operation can be initiated at operation 320 after the indicator is generated and stored at operation 315. In another embodiment, however, the indicator can be generated and stored in operation 315 after the memory access operation is initiated at operation 320. In addition, in yet another embodiment, the memory access operation can be initiated at operation 320 before the groups of programming distributions are identified at operation 310 and before the indicator is generated and stored in operation 315.

At operation 325, the indicator is read. For example, the processing logic can read the indicator, including the pages of group indicator data, from the portion of memory array 250 configured as SLC memory 252. In one embodiment, prior to performing the second pass of the multi-pass programming operation, program manager 134 can read the group indicator pages stored in SLC memory 252, which will indicate the group of programming distributions to which each memory cell in the QLC memory 254 belongs.

At operation 330, memory cells are identified. For example, the processing logic can identify a subset of the memory cells coarsely programmed at operation 315, which are associated with each of the groups of programming distributions based on the pages of group indicator data. In one embodiment, using the group indicator data, program manager 134 can identify a first subset of the memory cells that are associated with a first group of programming distributions, such as those memory cells programmed to a voltage level that falls within one of the programming distributions that make up the first group. Program manager 134 can perform a similar identification for each of the remaining groups of programming distributions.

At operation 335, read voltage levels are identified. For example, the processing logic can identify respective read voltage levels associated with each of the groups of programming distributions. Since there are different programming distributions in each group, there can also be different read voltages associated with each group. In one embodiment, these respective read voltage levels are designed to be located between the specific distributions of each particular group.

Figure 4:
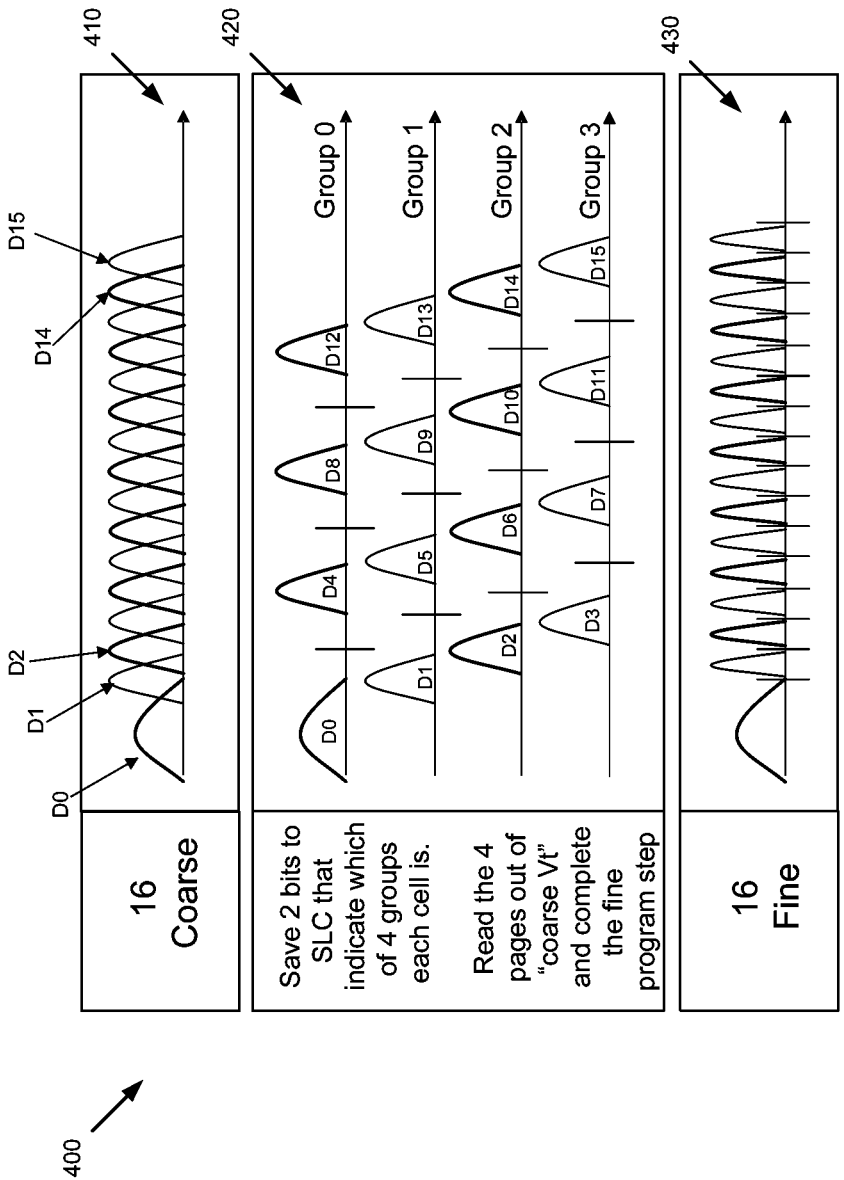
FIG. 4 is a graph illustrating programming distributions for double interleaved programming of a memory device in a memory sub-system in accordance with some embodiments of the present disclosure.

At operation 340, a memory access operation is continued. For example, the processing logic can continue the memory access operation on the memory array 250. In one embodiment, the memory access operation includes a multi-pass program operation, where the memory cells of the memory array 250 are programmed in two or more programming passes. In one embodiment, during the second pass of the multi-pass programming operations, the processing logic reads the coarsely programmed initial values from the first pass based on the indicator of the groups of programming distributions and, at operation 345, finely programs the memory cells in the portion of memory array 250 configured as QLC memory 254 to final values representing the pages of host data. In one embodiment, program manager 134 causes the respective read voltage levels identified at operation 335 to be applied to each of the groups of programming distributions. Upon determining the coarsely programmed initial values, program manager 134 can cause one or more programming voltage pulses to be applied to the memory cells in the portion of memory array 250 configured as QLC memory 254 to increase the initial values to the final values representing the pages of host data. Graph 430 of FIG. 4 illustrates the programming distributions of the finely programmed memory cells.

Figure 5:
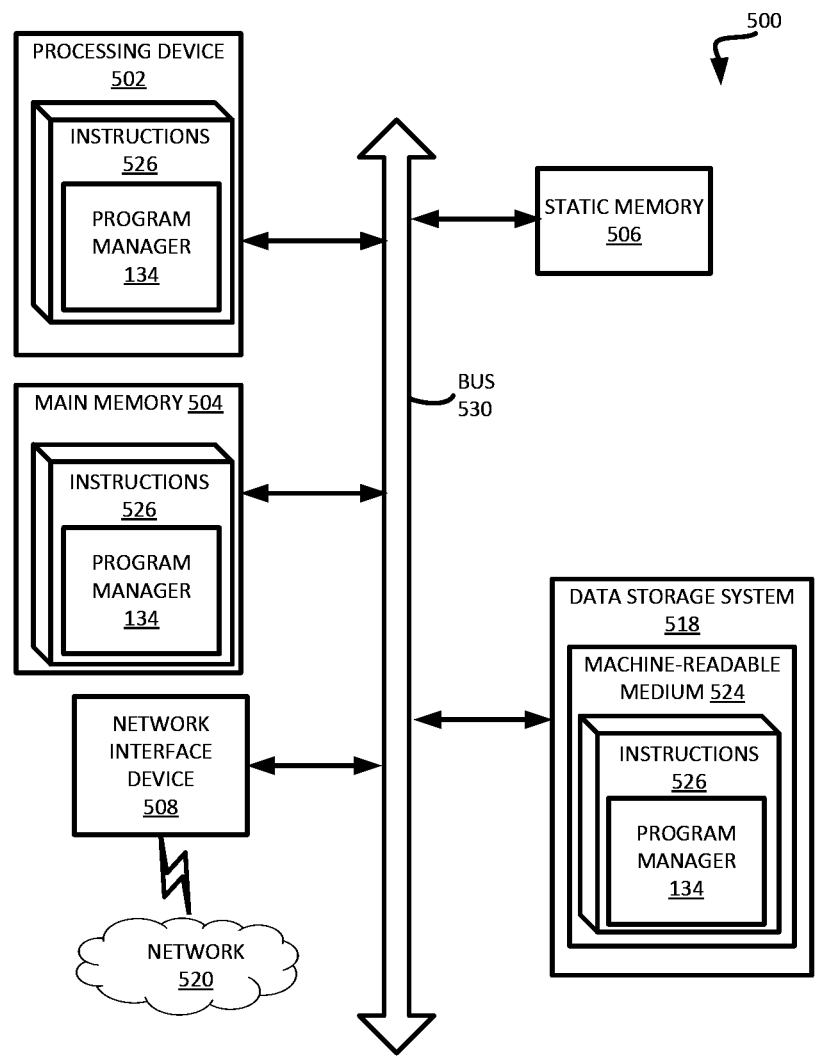
FIG. 5 is a block diagram of an example computer system in which embodiments of the present disclosure can operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to program manager 134 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium, such as a non-transitory computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to program manager 114 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
a memory array comprising a first portion configured as single-level cell (SLC) memory and a second portion configured as quad-level cell (QLC) memory; and
control logic, operatively coupled with the memory array, to perform operations comprising:
identifying a first plurality of groups of programming distributions, wherein each group comprises a subset of programming distributions associated with the second portion configured as QLC memory;
during a first pass of a multi-pass programming operation, coarsely programming memory cells in the second portion configured as QLC memory to initial values representing a second plurality of pages of host data;
storing, in the first portion configured as SLC memory and in response to completion of the first pass of the multi-pass programming operation, a respective indicator for each memory cell of the coarsely programmed memory cells to indicate a respective associated one of the first plurality of groups of programming distributions; and
during a second pass of the multi-pass programming operation, reading the coarsely programmed initial values from the first pass based on the indicator of the first plurality of groups of programming distributions and finely programming the memory cells in the second portion configured as QLC memory to final values representing the second plurality of pages of host data.

2. The memory device of claim 1, wherein the control logic is to perform further operations comprising:
receiving, from a requestor, a request to program the second plurality of pages of host data to the memory array.

3. The memory device of claim 1, wherein the indicator of the first plurality of groups comprises a third plurality of pages of group indicator data, wherein the third plurality of pages of group indicator data is less than the second plurality of pages of host data.

4. The memory device of claim 3, wherein the programming distributions associated with the second portion configured as QLC memory comprises 16 distributions,
wherein the first plurality of groups of programming distributions comprises four groups,
wherein the second plurality of pages of host data comprises four pages, and
wherein the third plurality of pages of group indicator data comprises two pages.

5. The memory device of claim 3, wherein the control logic is to perform further operations comprising:
reading the third plurality of pages of group indicator data from the first portion configured as SLC memory; and
identifying a subset of the coarsely programmed memory cells associated with each of the first plurality of groups of programming distributions based on the third plurality of pages of group indicator data.

6. The memory device of claim 5, wherein the control logic is to perform further operations comprising:
identifying respective read voltage levels associated with each of the first plurality of groups of programming distributions,
wherein reading the coarsely programmed initial values from the first pass based on the indicator of the first plurality of groups of programming distributions comprises causing the respective read voltage levels to be applied to each of the first plurality of groups of programming distributions.

7. The memory device of claim 1, wherein finely programming the memory cells in the second portion configured as QLC memory to final values representing the second plurality of pages of host data comprises causing one or more programming voltage pulses to be applied to the memory cells in the second portion configured as QLC memory to increase the initial values to the final values.

8. A method comprising:
identifying a first plurality of groups of programming distributions, wherein each group comprises a subset of programming distributions associated with a portion of a memory array of a memory device configured as quad-level (QLC) memory;
during a first pass of a multi-pass programming operation, coarsely programming memory cells in the portion configured as QLC memory to initial values representing a second plurality of pages of host data;
storing, in a portion of the memory array of the memory device configured as single-level cell (SLC) memory and in response to completion of the first pass of the multi-pass programming operation, a respective indicator for each memory cell of the coarsely programmed memory cells to indicate a respective associated one of the first plurality of groups of programming distributions; and
during a second pass of the multi-pass programming operation, reading the coarsely programmed initial values from the first pass based on the indicator of the first plurality of groups of programming distributions and finely programming the memory cells in the portion configured as QLC memory to final values representing the second plurality of pages of host data.

9. The method of claim 8, further comprising:
receiving, from a requestor, a request to program the second plurality of pages of host data to the memory array.

10. The method of claim 8, wherein the indicator of the first plurality of groups comprises a third plurality of pages of group indicator data, wherein the third plurality of pages of group indicator data is less than the second plurality of pages of host data.

11. The method of claim 10, wherein the programming distributions associated with the portion configured as QLC memory comprises 16 distributions,
wherein the first plurality of groups of programming distributions comprises four groups,
wherein the second plurality of pages of host data comprises four pages, and
wherein the third plurality of pages of group indicator data comprises two pages.

12. The method of claim 10, further comprising:
reading the third plurality of pages of group indicator data from the portion configured as SLC memory; and
identifying a subset of the coarsely programmed memory cells associated with each of the first plurality of groups of programming distributions based on the third plurality of pages of group indicator data.

13. The method of claim 12, further comprising:
identifying respective read voltage levels associated with each of the first plurality of groups of programming distributions,
wherein reading the coarsely programmed initial values from the first pass based on the indicator of the first plurality of groups of programming distributions comprises causing the respective read voltage levels to be applied to each of the first plurality of groups of programming distributions.

14. The method of claim 8, wherein finely programming the memory cells in the portion configured as QLC memory to final values representing the second plurality of pages of host data comprises causing one or more programming voltage pulses to be applied to the memory cells in the portion configured as QLC memory to increase the initial values to the final values.

15. A method comprising:
identifying four groups of programming distributions, wherein each group comprises four of 16 programming distributions associated with a first portion of a memory array of a memory device storing multiple bits of data per memory cell;
during a first pass of a multi-pass programming operation, coarsely programming memory cells in the first portion of the memory array to initial values representing four pages of host data;
in response to completion of the first pass of the multi-pass programming operation, storing, in a second portion of the memory array of the memory device storing one bit of data per cell, a respective indicator for each memory cell of the coarsely programmed memory cells to indicate a respective associated one of the four groups of programming distributions; and
during a second pass of the multi-pass programming operation, reading the coarsely programmed initial values from the first pass based on the indicator of the four groups of programming distributions and finely programming the memory cells in the first portion of the memory array to final values representing the second plurality of pages of host data.

16. The method of claim 15, further comprising:
receiving, from a requestor, a request to program the four pages of host data to the memory array.

17. The method of claim 15, wherein the indicator of the four groups comprises two pages of group indicator data.

18. The method of claim 17, further comprising:
reading the two pages of group indicator data from the second portion of the memory array; and
identifying a subset of the coarsely programmed memory cells associated with each of the four groups of programming distributions based on the two pages of group indicator data.

19. The method of claim 18, further comprising:
identifying respective read voltage levels associated with each of the four groups of programming distributions,
wherein reading the coarsely programmed initial values from the first pass based on the indicator of the four groups of programming distributions comprises causing the respective read voltage levels to be applied to each of the four groups of programming distributions.

20. The method of claim 15, wherein finely programming the memory cells in the first portion of the memory array to final values representing the four pages of host data comprises causing one or more programming voltage pulses to be applied to the memory cells in the first portion memory array to increase the initial values to the final values.

* * * * *